United States Patent
Cablao et al.

(10) Patent No.: US 7,786,575 B2
(45) Date of Patent: Aug. 31, 2010

(54) STACKED DIE SEMICONDUCTOR DEVICE HAVING CIRCUIT TAPE

(75) Inventors: Philip Lyndon R. Cablao, Singapore (SG); Dario S. Filoteo, Jr., Singapore (SG); Emmanuel A. Espiritu, Singapore (SG); Leo A. Merilo, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 0 days.

(21) Appl. No.: 12/631,476

(22) Filed: Dec. 4, 2009

(65) Prior Publication Data
US 2010/0078794 A1    Apr. 1, 2010

Related U.S. Application Data

(63) Continuation of application No. 11/532,387, filed on Sep. 15, 2006, now Pat. No. 7,659,608.

(51) Int. Cl.
*H01L 23/34* (2006.01)
*H01L 23/02* (2006.01)
*H01L 23/48* (2006.01)

(52) U.S. Cl. .............. 257/724; 257/685; 257/688; 257/723; 257/E23.034

(58) Field of Classification Search .............. 257/685, 257/688, 723, 724, E23.034
See application file for complete search history.

(56) References Cited

U.S. PATENT DOCUMENTS

| | | | |
|---|---|---|---|
| 5,273,938 A | 12/1993 | Lin et al. | |
| 5,463,253 A | 10/1995 | Waki et al. | |
| 5,866,952 A * | 2/1999 | Wojnarowski et al. | 257/788 |
| 5,905,639 A | 5/1999 | Warren | |
| 6,018,463 A * | 1/2000 | Winslow et al. | 361/803 |
| 6,313,520 B1 | 11/2001 | Yoshida et al. | |
| 6,320,257 B1 | 11/2001 | Jayaraj et al. | |
| 6,483,181 B2 | 11/2002 | Chang et al. | |
| 6,531,784 B1 | 3/2003 | Shim et al. | |
| 6,768,190 B2 | 7/2004 | Yang et al. | |
| 6,861,288 B2 | 3/2005 | Shim et al. | |
| 6,940,169 B2 | 9/2005 | Jin et al. | |
| 6,943,057 B1 | 9/2005 | Shim et al. | |
| 6,969,640 B1 | 11/2005 | Dimaano, Jr. et al. | |
| 7,005,325 B2 | 2/2006 | Chow et al. | |
| 7,064,430 B2 | 6/2006 | Chow et al. | |
| 7,071,421 B2 | 7/2006 | Heng et al. | |
| 7,166,914 B2 | 1/2007 | DiStefano et al. | |
| 7,176,506 B2 | 2/2007 | Beroz et al. | |
| 7,176,579 B2 | 2/2007 | Konishi et al. | |
| 7,190,069 B2 | 3/2007 | Youker et al. | |
| 7,201,327 B1 | 4/2007 | Park et al. | |
| 7,242,101 B2 | 7/2007 | Ararao et al. | |
| 7,268,426 B2 | 9/2007 | Warner et al. | |
| 7,304,370 B2 | 12/2007 | Imaizumi et al. | |

(Continued)

*Primary Examiner*—Ida M Soward

(57) ABSTRACT

A stacked die semiconductor package includes a first integrated circuit chip, a first circuit tape coupled to the first integrated circuit chip, a second integrated circuit chip coupled to the first circuit tape, and at least one component coupled to the first circuit tape. The at least one component may include one or more passive components, one or more active components, or a combination of passive and active components. The stacked die semiconductor package can also include a second circuit tape coupled to the second integrated circuit chip and a third integrated circuit chip coupled to the second circuit tape. The stacked die semiconductor package can also include an encapsulant.

11 Claims, 11 Drawing Sheets

U.S. PATENT DOCUMENTS

| | | |
|---|---|---|
| 7,423,885 B2 | 9/2008 | Cady et al. |
| 7,435,619 B2 | 10/2008 | Shim et al. |
| 2001/0011766 A1 | 8/2001 | Nishizawa et al. |
| 2004/0113271 A1 | 6/2004 | Takahashi et al. |
| 2005/0001305 A1 | 1/2005 | Kyung |
| 2005/0090050 A1 | 4/2005 | Shim et al. |
| 2006/0118937 A1 | 6/2006 | Katagiri et al. |
| 2006/0145339 A1 | 7/2006 | Yang et al. |
| 2007/0190690 A1* | 8/2007 | Chow et al. .......... 438/113 |
| 2008/0029867 A1 | 2/2008 | Kim et al. |
| 2008/0029868 A1 | 2/2008 | Lee et al. |
| 2008/0150103 A1 | 6/2008 | Wang et al. |

\* cited by examiner

PRIOR ART

STACKED DIE SEMICONDUCTOR DEVICE HAVING CIRCUIT TAPE

CROSS-REFERENCE TO RELATED APPLICATION(S)

This application is a continuation of U.S. patent application Ser. No. 11/532,387 filed Sep. 15, 2006.

TECHNICAL FIELD

The technical field relates generally to semiconductor devices and, more specifically, to stacked die semiconductor packages.

BACKGROUND

Semiconductor packages can be found in practically every electronic product manufactured today. As manufacturers strive to decrease the size while expanding the functionality of such products, the need for greater semiconductor package density increases. Multi-chip modules have been developed to help meet this need. Multi-chip modules generally have a number of integrated circuit (IC) chips, commonly referred to as dies, and other semiconductor components within a single semiconductor package. The dies and other semiconductor components can be arranged in various manners, such as vertically, horizontally, or in various combinations.

One multi-chip module approach is to stack a die on top of another and enclose the stacked dies in a single semiconductor package. Stacked die semiconductor packages are much smaller than if the dies were each packaged separately. Such stacked die packages also offer a number of manufacturing advantages. For example, stacked dies are easier to handle and assemble, and generally are fabricated faster and cheaper than multiple semiconductor packages each having a single die.

In some stacked die semiconductor packages, an interposer may be used. For example, U.S. Pat. No. 6,861,288 to Shim et al. describes, as illustrated in FIG. 1, a method of fabricating a stacked semiconductor package 100 that includes mounting a first semiconductor device 102 on a substrate 104, supporting an interposer 106 electrically connected to the substrate 104 above the first semiconductor device 102 opposite the substrate 104, and mounting a second semiconductor device 108 on the interposer 106. See col. 3, lines 48-54. In this arrangement, a thermal glue or film adhesive spacer 110 is attached to the interposer 106. See col. 5, lines 58-62. The interposer 106 may be supported and reinforced by a thermally conductive metal stiffener 112. See col. 6, lines 1-5. Also, the side and top perimeter of the interposer 106 are encapsulated but the top central portion of the interposer 106 is not encapsulated, thereby forming a partially molded bottom package having an open cavity on top in which the central part of the top of the interposer 106 is exposed. See col. 6, lines 13-19.

A high density multi-chip interconnect (HDMI) decal may be used in some stacked die semiconductor packages. For example, U.S. Pat. No. 5,905,639 to Warren describes, as illustrated in FIG. 2, a three-dimensional circuit structure 200. The circuit structure 200 interconnects an integrated circuit chip 202 and additional active devices and passive components 204-212 to a substrate 214 using an HDMI decal 216 disposed on the integrated circuit chip 202. See col. 1, lines 28-33. In this arrangement, the active and passive components 204-212 are connected to the HDMI decal 216 using conductive or non-conductive epoxy. See col. 1, lines 50-53.

Despite the advantages of the various developments in semiconductor packaging technology, there remains a need for increased semiconductor package density.

SUMMARY

A stacked die semiconductor package can comprise a first integrated circuit chip, a first circuit tape coupled to the first integrated circuit chip, a second integrated circuit chip coupled to the first circuit tape, and at least one, and more typically multiple components, also coupled to the circuit tape. The components can include passive components, active components, or a combination thereof. The integrated circuit chips, circuit tape, and components all can be encapsulated by an encapsulant at least partially or substantially completely.

In one exemplary embodiment, more than two integrated circuit chips are stacked, one on top of another, with at least one layer of circuit tape coupled to the top and/or bottom side of each integrated circuit chip. Each of the integrated circuit chips can have a different surface area size and/or shape. Multiple layers of circuit tape can be applied, and the circuit tape can serve as both an interposer and a spacer between dies.

In another exemplary embodiment, multiple pieces of circuit tape are coupled to a first integrated circuit chip. Two or more additional integrated circuit chips are coupled to the pieces of circuit tape, with each additional integrated circuit chip being coupled to its own corresponding piece of circuit tape. Additional pieces of circuit tape can be coupled to one or more of the additional integrated circuit chips.

In one exemplary embodiment, a method of making a stacked die semiconductor package includes providing a first die and coupling the first die to the top of a substrate. A circuit tape is affixed to the top of the first die. A second die is coupled to the top of the circuit. Various components are also coupled to the top of the circuit tape. In some embodiments, the stacked die semiconductor package is encapsulated by an encapsulant. In some embodiments, additional circuit tapes are coupled to the first and/or second dies and additional dies and/or components are coupled to some or all of the additional circuit tapes.

The foregoing and other objects, features, and advantages of the disclosed technologies will become more apparent from the following detailed description, which proceeds with reference to the accompanying figures.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" generally means electrically, electromagnetically, and/or physically (e.g., mechanically or chemically) coupled or linked and does not exclude the presence of intermediate elements between the coupled items.

Although the operations of exemplary embodiments of the disclosed method may be described in a particular, sequential order for convenient presentation, it should be understood that disclosed embodiments can encompass an order of operations other than the particular, sequential order disclosed. For example, operations described sequentially may in some cases be rearranged or performed concurrently.

Moreover, for the sake of simplicity, the attached figures may not show the various ways (readily discernable, based on this disclosure, by one of ordinary skill in the art) in which the disclosed system, method, and apparatus can be used in combination with other systems, methods, and apparatuses. Additionally, the description sometimes uses terms such as "produce" and "provide" to describe the disclosed method. These terms are high-level abstractions of the actual operations that can be performed. The actual operations that correspond to these terms can vary depending on the particular implementation and are, based on this disclosure, readily discernible by one of ordinary skill in the art.

Exemplary Embodiments of a Stacked Die Semiconductor Package Using Circuit Tape

Figure 1:
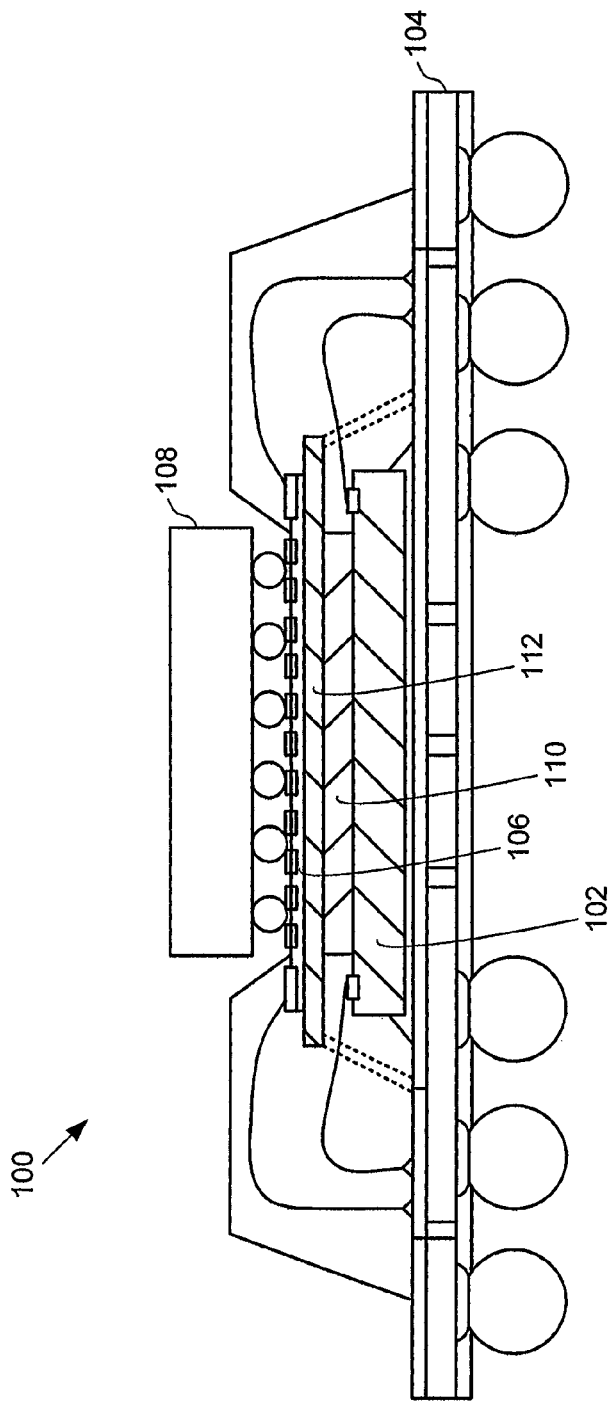
FIG. 1 is a cross-sectional view of a prior art stacked die semiconductor package having an interposer as disclosed by U.S. Pat. No. 6,861,288.
Figure 2:
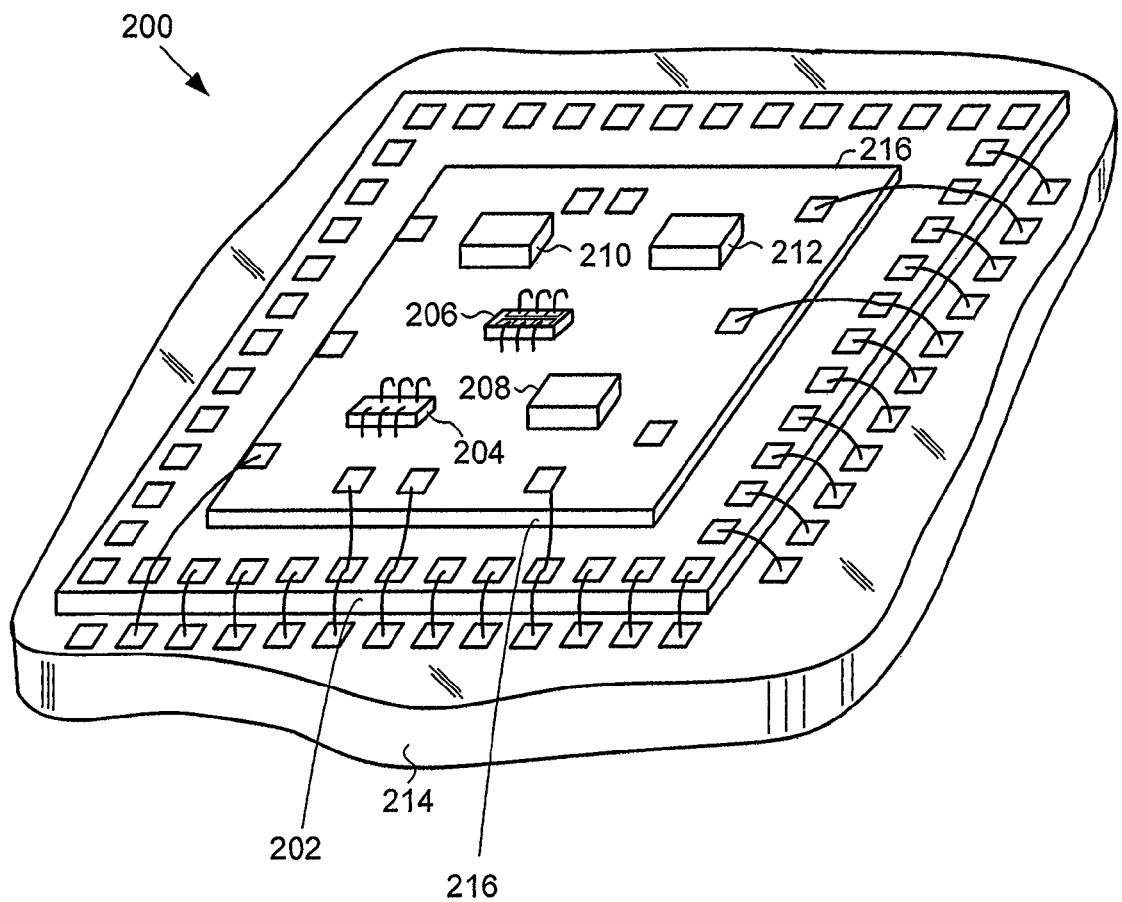
FIG. 2 is a three-dimensional view of a prior art stacked die semiconductor package using a high density multi-chip interconnect (HDMI) decal as disclosed by U.S. Pat. No. 5,905,639.
Figure 3:
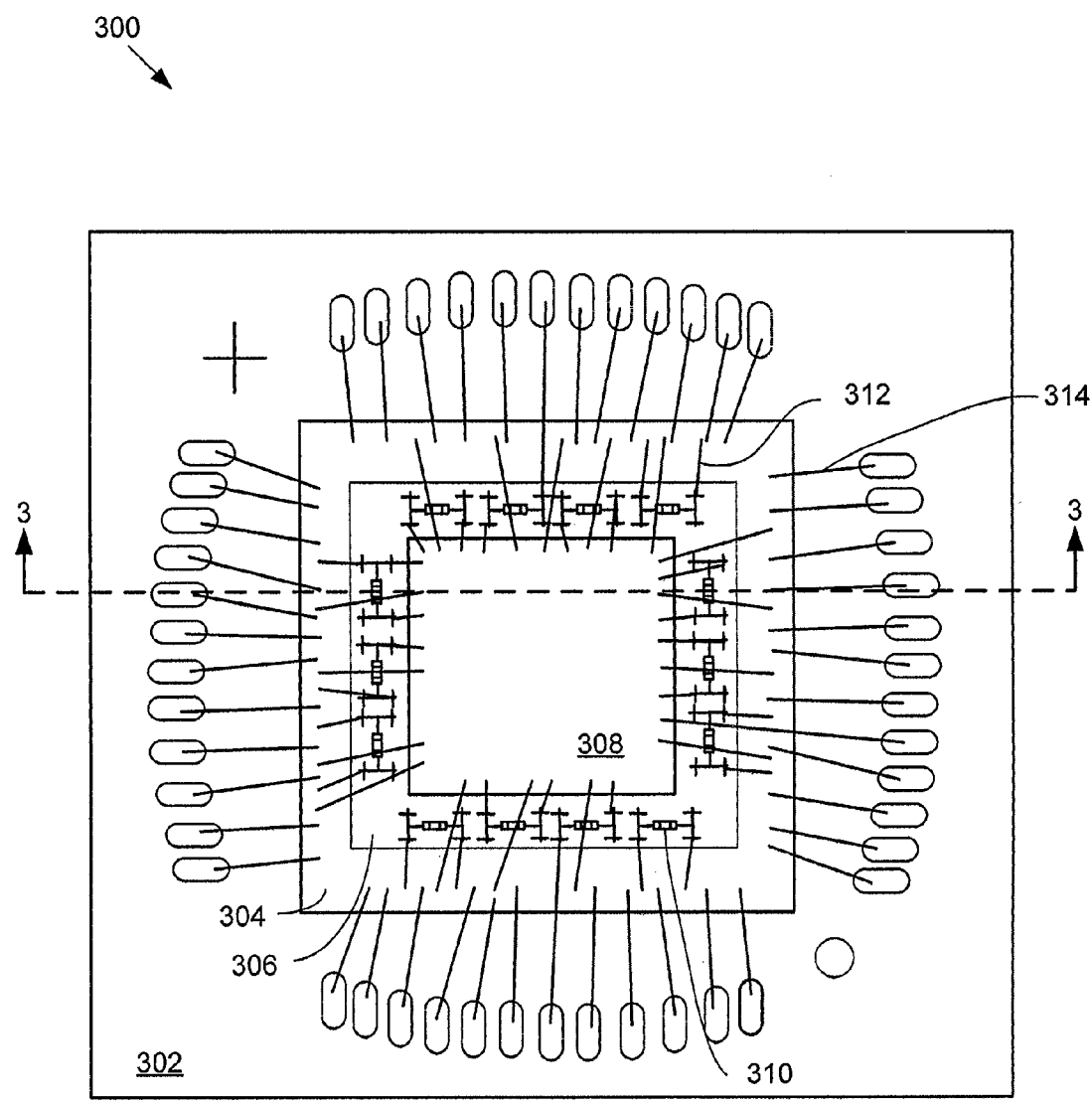
FIG. 3 is a plan view of an exemplary embodiment of a stacked die semiconductor package comprising circuit tape.

FIG. 3 is a plan view of an exemplary embodiment of a pyramidal stacked die semiconductor package 300 comprising a substrate 302 to which a first die 304 is coupled. In this exemplary embodiment, the first die 304 is the bottom die. Also, the substrate 302 has a larger surface area than that of the first die 304. In other embodiments, the substrate and the first die may be substantially similar in shape and/or size, either area, volume, or both. Dies generally have, but are not limited to, square or rectangular shapes.

Circuit tape 306 is coupled to the top surface of the first die 304. In an exemplary embodiment, circuit tape 306 is composed of a polyimide insulating material and a copper layer. The circuit tape 306 can be coupled to the first die 304 using a variety of techniques. For example, adhesive material may be used in combination with the circuit tape 306, may be applied to the circuit tape 306, or the circuit tape 306 can be prefabricated with adhesive material. In this exemplary embodiment, only one layer of circuit tape 306 is used. In other embodiments, multiple layers of circuit tape 306 may be used, wherein each layer may be of a size and/or shape the same as or different from the other layers.

At least one, and potentially plural, passive components 310 are coupled to the top side of the circuit tape 306. Passive components generally refer to electronic components that do not require an energy source in order to function (e.g., resistors, capacitors, and inductors). The passive components 310 can be coupled directly to the circuit tape 306 without using an adhesive. In alternative embodiments, active components are coupled to the top side of the circuit tape 306 instead of passive components. Active components generally refer to electronic components that require an energy source in order to perform their intended functions (e.g., diodes and transistors). In other embodiments, a combination of active and passive components are coupled to the top side of circuit tape 306.

A second die 308 also is coupled to the top side of the circuit tape 306. In this exemplary embodiment, the second die 308 is the top die and has a smaller surface area than that of the first die 304. This arrangement is generally referred to as pyramidal stacking. In other embodiments, the first die 304 and second die 308 may have surface areas that are substantially similar in size and/or shape. In yet other embodiments, the first die 304 may have a smaller surface area than that of the second die 308, an arrangement that is generally referred to as inverse pyramidal stacking.

In some embodiments (not shown), the stacked die semiconductor package 300 may include three or more dies stacked one on top of the other. In such an arrangement, at least one layer of circuit tape is used and generally plural layers are used, such as by placing circuit tape on top of and/or below each die. Multiple layers of circuit tape may be used on top of and/or below any of the dies. Each of the layers of circuit tape may have various shapes and/or sizes. The dies also may have various shapes and/or sizes.

In the exemplary embodiment of FIG. 3, the circuit tape 306 is interconnected to both the first die 304 and the second die 308 by wire-bonds 312 and 314, respectively. In other embodiments, the circuit tape 306 may be interconnected directly to the substrate 302.

Figure 4:
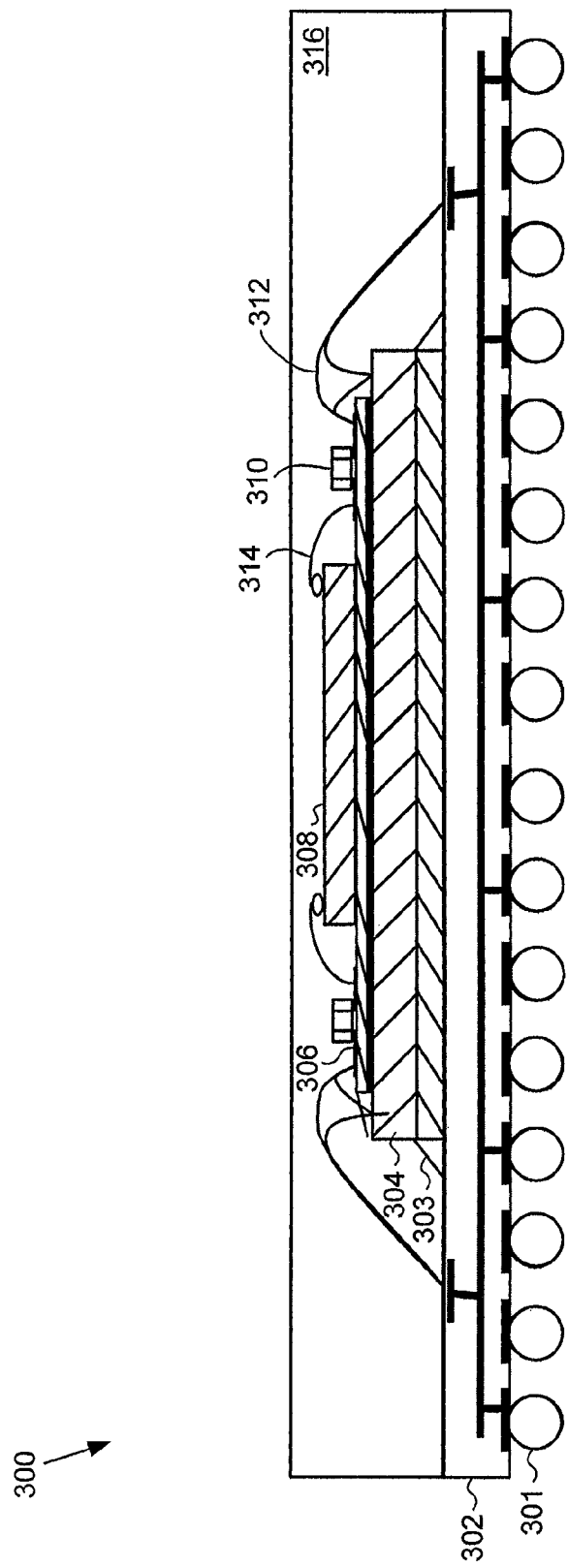
FIG. 4 is a cross-sectional view of the exemplary stacked die semiconductor package of FIG. 3.

FIG. 4 is a cross-sectional view of the exemplary pyramidal stacked die semiconductor package 300 taken along broken line 3-3 indicated in FIG. 3. A person of ordinary skill in the art can appreciate that the first die 304 can be coupled, for example, to the substrate 302 by an adhesive 303. On the bottom side of the substrate 302 is an array of ball grids 301 for connecting the stacked die semiconductor package 300 to an external substrate, such as a printed circuit board ("PCB") (not shown).

As described above with respect to FIG. 3, the circuit tape 306 is directly coupled to the first die 304 and the second die 308 is directly coupled to the circuit tape 306. At least one component 310 also is coupled to the circuit tape 306. In this exemplary embodiment, all of the components on top of the substrate 302 are encapsulated by an encapsulant 316. This can be done, for example, to protect the physical and environmental integrity of the stacked die semiconductor package 300. Any of a variety of encapsulating materials, and combinations thereof, may be used for the encapsulant 316. Complete encapsulation is advantageous, for example, when the circuit tape 306 is used as an interposer, because none of the circuit tape 306 is exposed to the external elements.

Figure 5:
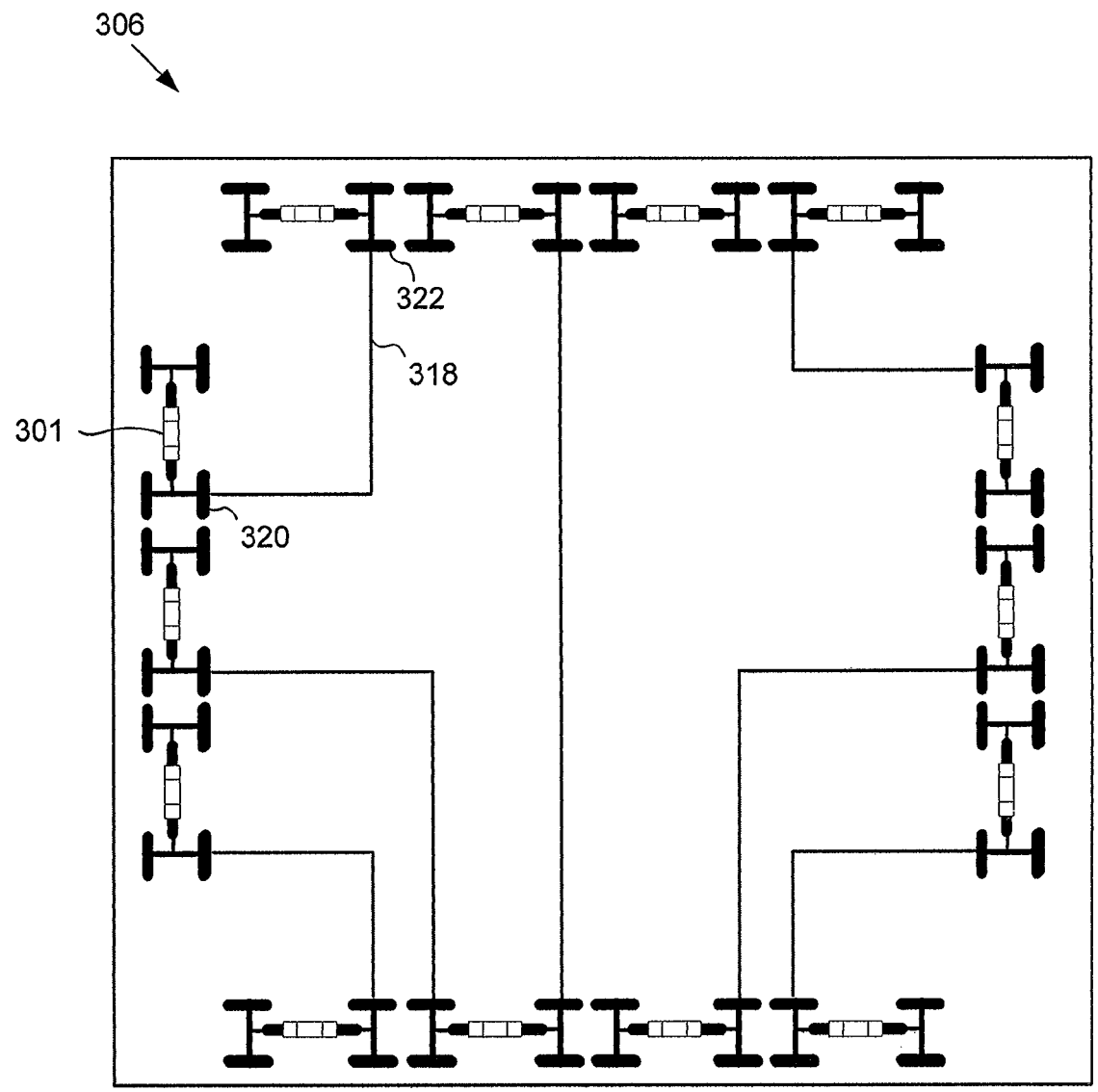
FIG. 5 is a plan view of the exemplary circuit tape of FIG. 3.

FIG. 5 is a plan view of the exemplary circuit tape 306 of FIG. 3. One of ordinary skill in the art can appreciate that this view shows the circuit tape 306 with the various components, such as a resistor 301, coupled thereto as well as exemplary traces, such as a trace 318 connecting a first bond pad 320 to a second bond pad 322.

Figure 6:
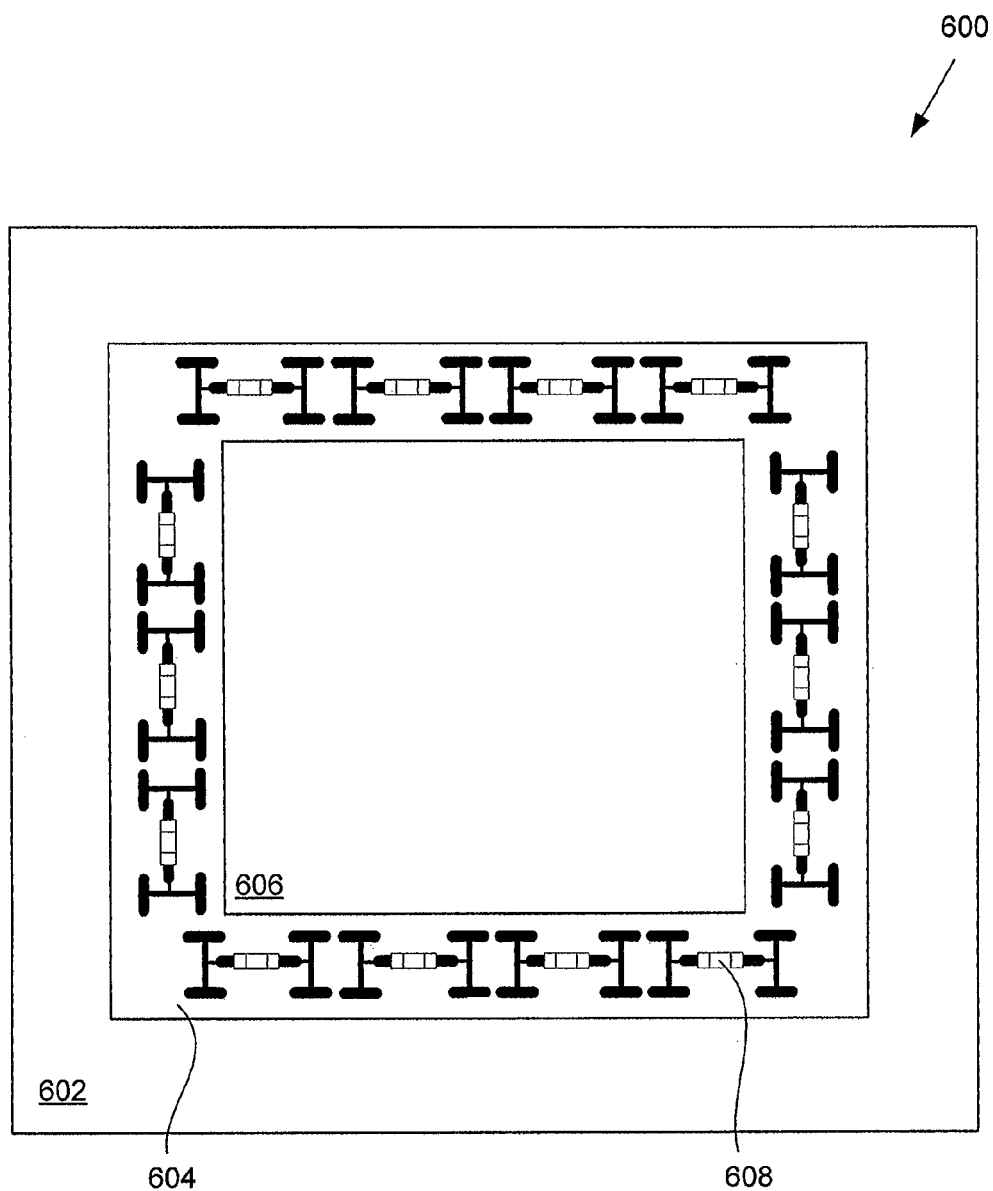
FIG. 6 is a plan view of an exemplary embodiment of a pyramidal stacked die semiconductor package that is made using or comprising circuit tape.

FIG. 6 is a plan view of an exemplary embodiment of a pyramidal stacked die semiconductor package 600. A first die 602, or bottom die, is coupled to the top surface of a substrate (not shown). A piece of circuit tape 604 is coupled to the top surface of the first die 602. At least one, and typically multiple, components 608 are coupled to the top surface of the circuit tape 604. The components 608 may include passive components, active components, or a combination thereof. A second die 606, or top die, is also positioned on top of and coupled to the top surface of the circuit tape 604. In this exemplary embodiment, the circuit tape 604 includes a first layer and a second layer (not illustrated). The second layer is positioned between the first layer and the second die 606. The second layer is not visible because it is substantially the same size as the second die 606 and, therefore, the second die 606 obscures the second layer of the circuit tape 604 when viewing a plan view of the stacked die semiconductor package 600.

Figure 7:
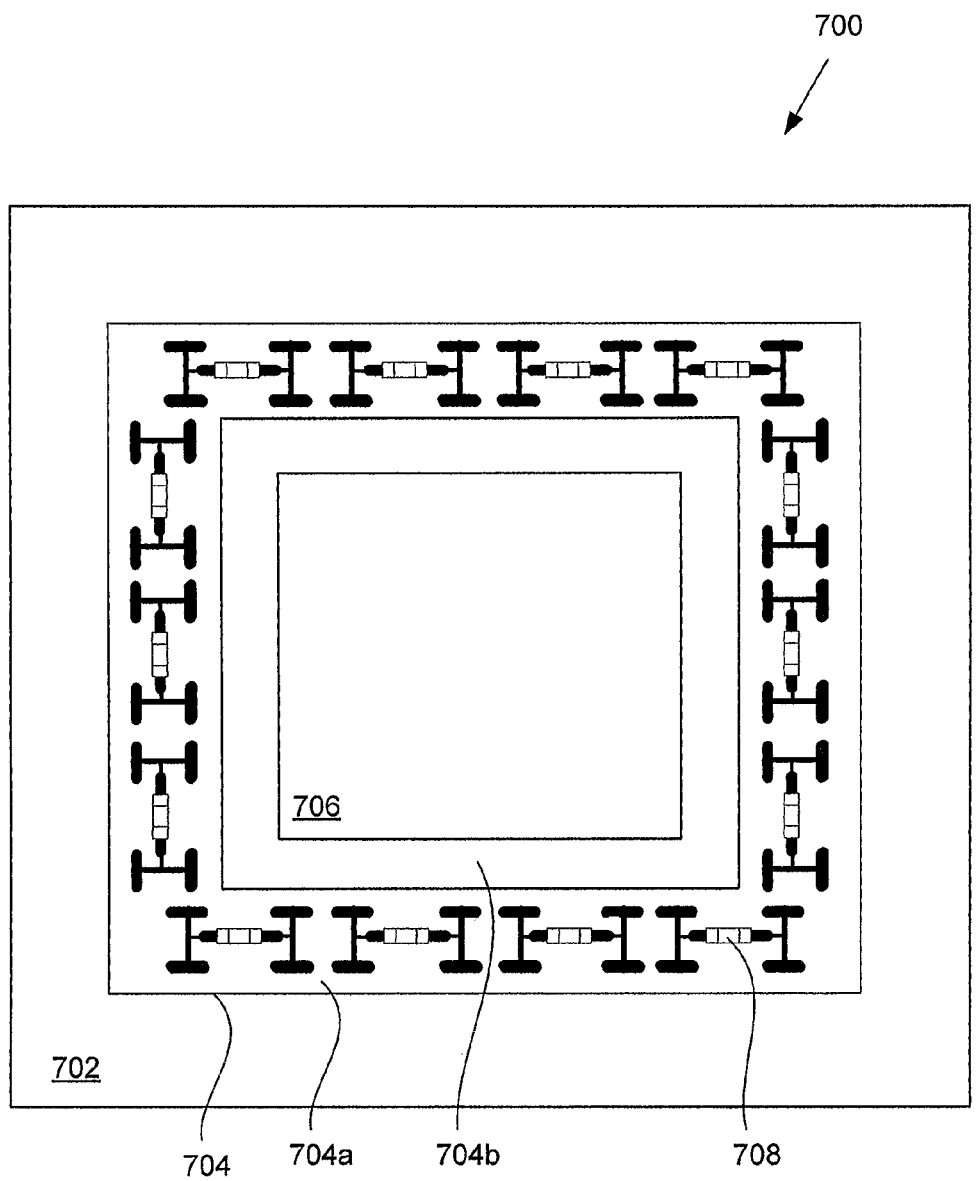
FIG. 7 is a plan view of an alternative exemplary embodiment of a pyramidal stacked die semiconductor package that is made using or comprising circuit tape.

FIG. 7 is a plan view of an alternative exemplary embodiment of a pyramidal stacked die semiconductor package 700. A first die 702, or bottom die, is coupled to the top surface of a substrate (not shown). A piece of circuit tape 704 is coupled to the top surface of the first die 702. At least one, and typically multiple, passive and/or active components 708 are coupled to the top surface of the circuit tape 704. A second die 706, or top die, also is coupled to the top surface of the circuit tape 704. In this exemplary embodiment, the circuit tape 704 includes a first layer 704a and a second layer 704b, wherein the second layer 704b is between the first layer 704a and the second die 706. In this exemplary embodiment, a portion of the second layer 704b can be seen in a plan view because the second die 706 is smaller in area than the second layer 704b of the circuit tape 704.

Figure 8:
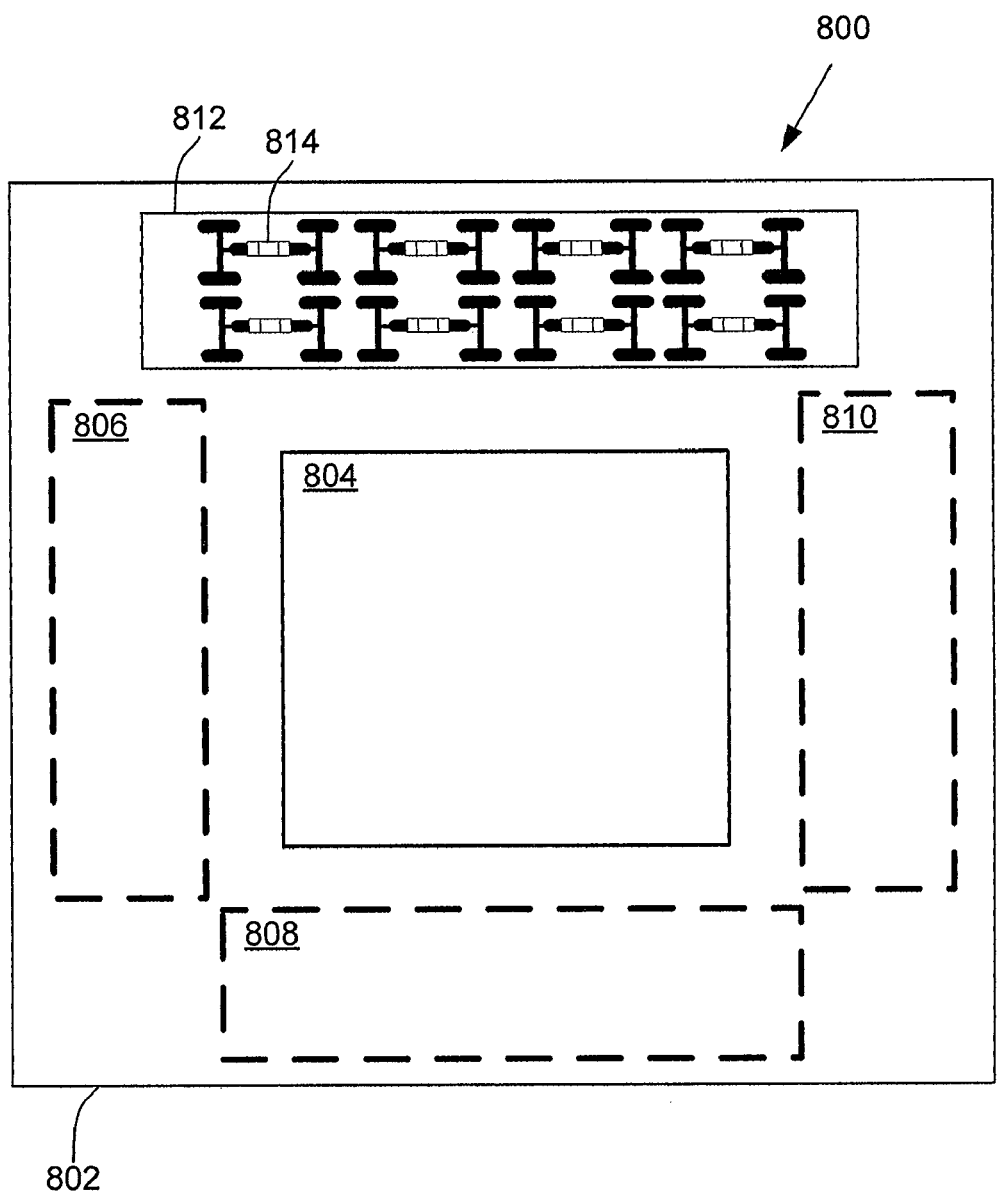
FIG. 8 is a plan view of another alternative exemplary embodiment of a pyramidal stacked die semiconductor package that is made using or comprising circuit tape.

FIG. 8 is a plan view of another alternative exemplary embodiment of a pyramidal stacked die semiconductor package 800. In this exemplary embodiment, five pieces of circuit tape 804, 806, 808, 810, and 812 are coupled to a die 802. Three of the pieces 806, 808, and 810 are mounted on the bottom side of the die 802, as indicated by dashed lines, while two of the pieces 804 and 812 are mounted on the top side of the die 802. One piece 804 is sized and positioned to allow for a second die (not shown) to be coupled to the top side of the piece 804. Circuit tape 812 is configured to allow for at least one, and potentially multiple passive components 814, to be affixed to the top side of the piece 812. Circuit tape pieces 806, 808, and 810 affixed on the bottom side of the die 802 similarly can be configured to provide mounting locations for passive and/or active components.

One of ordinary skill in the art can appreciate that any number of pieces of circuit tape may be used on either the top and/or bottom sides of a substrate and that the pieces of circuit tape used may be of virtually any size and shape. As discussed above, multiple layers of circuit tape also can be used, such as placing a top layer of circuit tape on top of a bottom layer of circuit tape.

Figure 9:
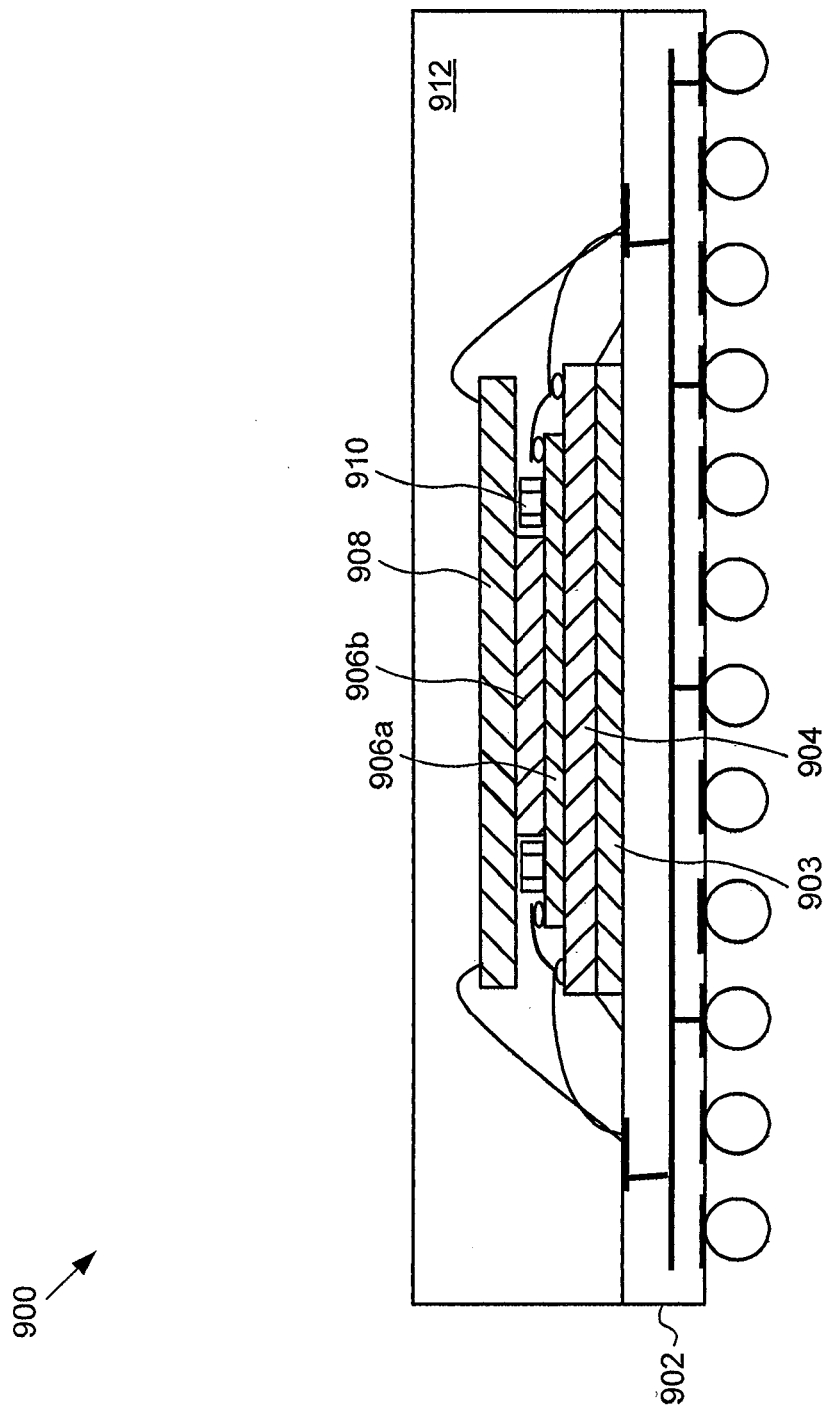
FIG. 9 is a cross-sectional view of an exemplary embodiment of a stacked die semiconductor package made using circuit tape and comprising dies of substantially the same size.

FIG. 9 is a cross-sectional view of an exemplary embodiment of a stacked die semiconductor package 900 comprising a substrate 902. A first die 904 is effectively coupled to the substrate 902 using an adhesive 903. A second die 908 is coupled to circuit tape, which is coupled to the first die 904. In this exemplary embodiment, the circuit tape has a bottom layer 906a and a top layer 906b. The top layer 906b has a smaller area/volume than the bottom layer 906a, thereby acting as a spacer and allowing for at least one and typically multiple components 910 to be coupled to the circuit tape 906 directly underneath the second die 908. This configuration is advantageous, because it provides for increased package density relative to configurations not using circuit tape. An encapsulant 912 at least partially and typically completely covers all of the components mounted on top of the substrate 902.

Exemplary Embodiments of Circuit Tape

Figure 10:
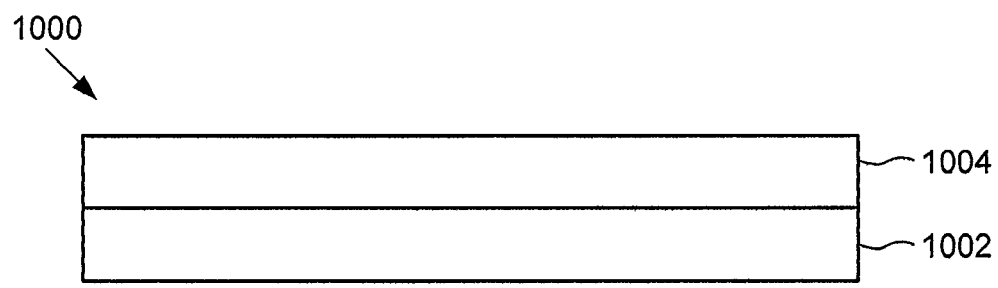
FIG. 10 is a cross-sectional view of an exemplary embodiment of circuit tape.

FIG. 10 is a cross-sectional view of an exemplary embodiment of circuit tape 1000. Use of the circuit tape 1000 includes a metal layer 1002 and an insulating layer 1004. The metal layer 1002 can be made from any one of, or a combination of, a number of different types of metals or alloys, such as copper, nickel, gold, and solder alloy, for example. The insulating layer 1004 can be made from any one of, or a combination of, any number of different types of insulating materials, such as polyimide material, polyester tape, and treated paper laminate, for example. As will be illustrated by other alternative embodiments, the circuit tape 1000 can include any number and combination of metal and insulating layers.

Figure 11:
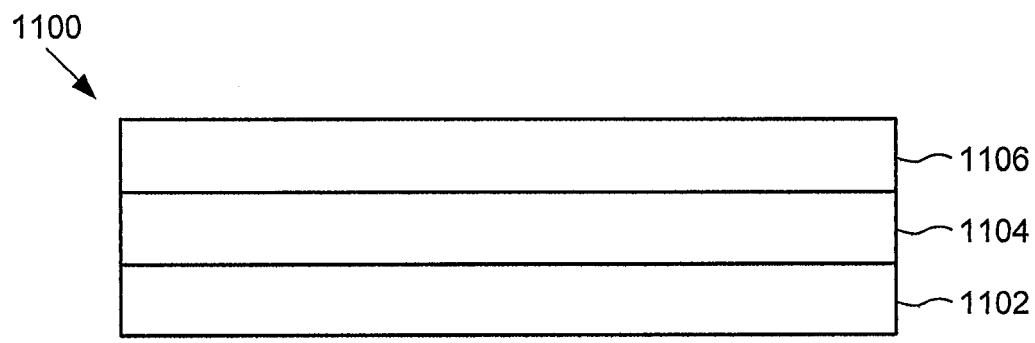
FIG. 11 is a cross-sectional view of an alternative exemplary embodiment of circuit tape.

FIG. 11 is a cross-sectional view of an alternative exemplary embodiment of circuit tape 1100. The circuit tape 1100 includes a first insulating layer 1102, a metal layer 1104 positioned above the top side of the first insulating layer 1102, and a second insulating layer 1106 positioned above the top side of the metal layer 1104. As discussed above with respect to FIG. 10, the metal layer 1104 can be made from any one of, or a combination of, a number of different types of metals or alloys. Also, the first and second insulating layers 1102 and 1106 can be made from any one of, or a combination of, any number of different types of insulating materials.

Figure 12:
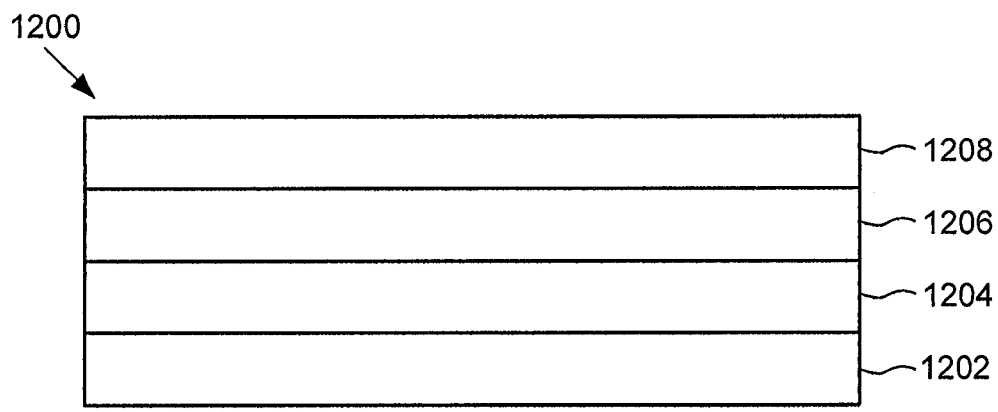
FIG. 12 is a cross-sectional view of another alternative exemplary embodiment of circuit tape.

FIG. 12 is a cross-sectional view of another alternative exemplary embodiment of circuit tape 1200. The circuit tape 1200 includes four layers: a first insulating layer 1202, a first metal layer 1204 positioned above the top side of the first insulating layer 1202, a second insulating layer 1206 positioned above the top side of the first metal layer 1204, and a second metal layer 1208 positioned above the top side of the second insulating layer 1206.

Figure 13:
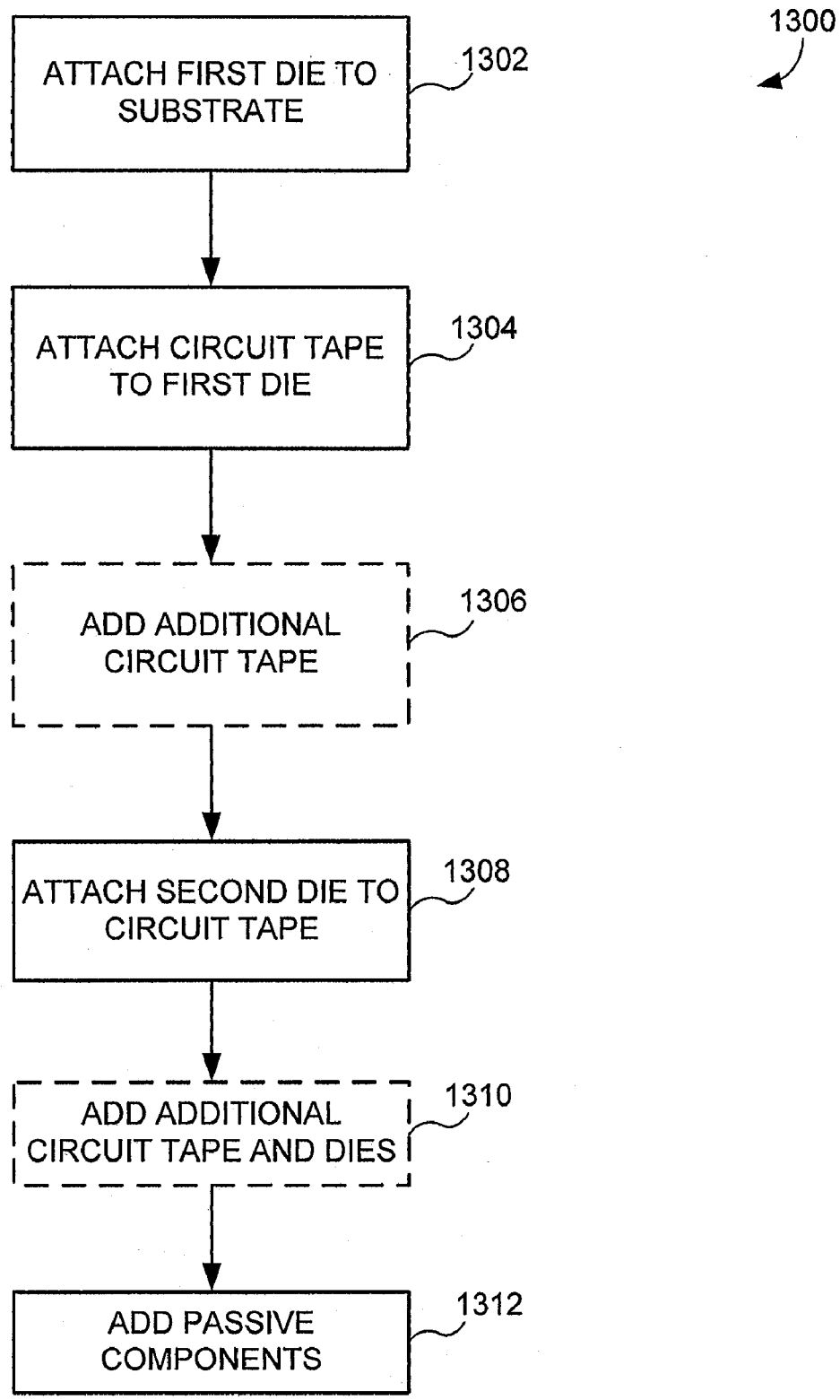
FIG. 13 is a flowchart of an exemplary method for creating a stacked die semiconductor package using circuit tape.

Exemplary Embodiments of a Method of Creating a Stacked Die Semiconductor Package Using Circuit Tape FIG. 13 is a flowchart of an exemplary method 1300 for creating a stacked die semiconductor package using circuit tape. A first die can be coupled to the top surface of a substrate (step 1302). The first die as positioned on the substrate may include circuit tape, or a layer of circuit tape can be applied to the top surface of the first die (step 1304). In some embodiments, an additional layer or layers of circuit tape can be applied to the top surface of the previously applied layer of circuit tape (step 1306). A second die then can be attached to the top surface of the topmost layer of circuit tape (step 1308). In some embodiments, an additional layer or layers of circuit tape can be applied to the top surface of the second die such that an additional die or dies can be mounted on top (step 1310). One or more components (e.g., active and/or passive components) also can be affixed to the top surface of the topmost layer of circuit tape (step 1312). In some embodiments, circuit tape can be affixed to the bottom side of the first die, thereby allowing one or more additional dies to be attached to the bottom of the first die.

In an alternative embodiment, a first die can be coupled to the top surface of a substrate. One or more layers of circuit tape can be applied to the bottom of a second die, thereby allowing the second die to be effectively coupled to the top surface of the first die. One or more layers of circuit tape can be applied to the bottom surface of a third die such that the third die can be effectively coupled to the top surface of the second die.

The exemplary embodiments of the disclosed system, method, and apparatus should not be construed as limiting in any way. Instead, the present disclosure is directed toward all novel and nonobvious features, aspects, and equivalents of the various disclosed embodiments, alone and in various combinations and sub-combinations with one another. The disclosed technology is not limited to any specific aspect, feature, or combination thereof, nor do the disclosed system, method, and apparatus require that any one or more specific advantages be present or problems be solved. The scope of the invention is defined by the following claims. We therefore claim as our invention all that comes within the scope and spirit of these claims.

The invention claimed is:

1. A semiconductor device, comprising:
    a first integrated circuit chip;
    a first circuit tape coupled to the first integrated circuit chip;
    a second integrated circuit chip coupled to the first circuit tape; and
    at least one component coupled to the first circuit tape.

2. The semiconductor device of claim 1, wherein the at least one component comprises at least one passive component.

3. The semiconductor device of claim 1, wherein the at least one component comprises at least one active component.

4. The semiconductor device of claim 1, wherein the at least one component comprises at least one passive component and at least one active component.

5. The semiconductor device of claim 1, wherein a bottom surface of the first integrated circuit chip is coupled to a substrate and the first circuit tape is coupled to a top surface of the first integrated circuit chip opposite the bottom surface.

6. The semiconductor device of claim 1, wherein the second integrated circuit chip is coupled to a top surface of the first circuit tape.

7. The semiconductor device of claim 1, wherein the at least one component coupled to the first circuit tape is coupled to a top surface of the first circuit tape.

8. The semiconductor device of claim 1, wherein the first integrated circuit chip has a surface area smaller than a surface area of the second integrated circuit chip.

9. The semiconductor device of claim 1, wherein the first integrated circuit chip has a surface area larger than a surface area of the second integrated circuit chip.

10. The semiconductor device of claim 1, wherein the first integrated circuit chip has a surface area substantially similar to a surface area of the second integrated circuit chip.

11. The semiconductor device of claim 1, further comprising a first encapsulant.

* * * * *